US011665869B2

(12) United States Patent
Leclerc et al.

(10) Patent No.: US 11,665,869 B2
(45) Date of Patent: May 30, 2023

(54) INTERNAL COMPONENT ARCHITECTURE FOR A DISPLAY

(71) Applicant: Apple Inc., Cupertino, CA (US)

(72) Inventors: Michael E. Leclerc, Mountain View, CA (US); Kevin J. Ryan, Mountain View, CA (US); Brett W. Degner, Menlo Park, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/398,941

(22) Filed: Aug. 10, 2021

(65) Prior Publication Data
US 2022/0354031 A1 Nov. 3, 2022

Related U.S. Application Data

(60) Provisional application No. 63/182,722, filed on Apr. 30, 2021.

(51) Int. Cl.
*H05K 7/20* (2006.01)
*H04R 1/02* (2006.01)
(Continued)

(52) U.S. Cl.
CPC ......... *H05K 7/20972* (2013.01); *G06F 1/206* (2013.01); *H04R 1/028* (2013.01);
(Continued)

(58) Field of Classification Search
CPC ............. H05K 7/20972; H05K 5/0213; H05K 7/20172; H05K 7/20145; H05K 7/20136;
(Continued)

(56) References Cited

U.S. PATENT DOCUMENTS 4,980,848 A * 12/1990 Griffin .................... G06F 1/203
361/679.09
5,634,351 A * 6/1997 Larson ................ F28D 15/0266
361/679.55
(Continued)

FOREIGN PATENT DOCUMENTS

| CN | 112255802 A | 1/2021 |
| CN | 112291977 A | 1/2021 |
| CN | 112394520 A | 2/2021 |

*Primary Examiner* — Michael A Matey
(74) *Attorney, Agent, or Firm* — Bakerhostetler

(57) ABSTRACT

This application relates to display devices and the layout/architecture of various internal components to enhance thermal energy management. A display device described herein may include one or more fan assemblies that drive ambient air into the display device to cool heat-generating components of the display device, and also to drive the ambient air, once heated through convectively cooling the heat-generating components, out of the display device. Further, the location of the heat-generating components is such that the heat-generating components upstream relative to the one or more fan assemblies. In this manner, the ambient air can pass over or through the heat-generating components prior to reaching the one or more fan assemblies. Additionally, heat-generating components, such as a backlit device and a power supply unit, are positioned relatively close to vent inlets in the display device. As a result, these heat-generating devices are immediately cooled with the ambient air.

19 Claims, 11 Drawing Sheets

(51) Int. Cl.
H05K 5/02 (2006.01)
G06F 1/20 (2006.01)
H04R 5/02 (2006.01)

(52) U.S. Cl.
CPC ............ H05K 5/0213 (2013.01); *H04R 5/02* (2013.01); *H04R 2499/15* (2013.01)

(58) Field of Classification Search
CPC ....... H05K 7/20163; G06F 1/20; G06F 1/206; G06F 1/1601; G06F 2200/201; G06F 1/16; G06F 1/1637; G06F 1/1688; G06F 2200/1612; G06F 1/1605; G06F 1/26; G06F 1/266; G06F 3/147; G06F 3/165; H04R 1/028; H04R 5/02; H04R 2499/15; H04R 9/022; H04R 1/2819; H04R 1/2826; H04R 1/2888; H04R 1/023; H04R 3/12; H04R 1/403; H04R 9/06; F21V 33/0056; G02F 2201/36
See application file for complete search history.

(56) References Cited

U.S. PATENT DOCUMENTS

| | | | |
|---|---|---|---|
| 10,492,346 B2 | 11/2019 | Selvakumar et al. | |
| 11,058,026 B1 | 7/2021 | Marić et al. | |
| 2005/0185376 A1* | 8/2005 | Sawyer ................. | G06F 1/1688 361/679.48 |
| 2005/0211498 A1* | 9/2005 | Osada .................... | H04R 9/022 181/156 |
| 2005/0285832 A1* | 12/2005 | Shin ........................ | G09G 5/006 345/87 |
| 2006/0036885 A1* | 2/2006 | Hsieh ...................... | G06F 1/266 713/300 |
| 2006/0164804 A1* | 7/2006 | Kim ................... | H05K 7/20972 361/688 |
| 2008/0089028 A1* | 4/2008 | Kim .................. | G02F 1/133608 165/104.33 |
| 2008/0239634 A1* | 10/2008 | Nakao ................... | G06F 1/1601 361/678 |
| 2008/0285290 A1* | 11/2008 | Ohashi ................. | G02B 6/0085 362/373 |
| 2009/0086430 A1* | 4/2009 | Kang ................ | G02F 1/133385 165/185 |
| 2009/0174626 A1* | 7/2009 | Isoshima ............ | H05K 7/20972 345/55 |
| 2011/0310557 A1* | 12/2011 | Ooe ......................... | G06F 1/20 361/692 |
| 2012/0118327 A1* | 5/2012 | Mazmanyan ........... | B08B 15/00 15/300.1 |
| 2013/0070159 A1* | 3/2013 | Ooe ........................ | H04N 5/655 361/807 |
| 2013/0083253 A1* | 4/2013 | Maeshima ................ | G06F 1/20 348/739 |
| 2013/0194744 A1* | 8/2013 | Chen ..................... | H01L 23/467 165/104.34 |
| 2015/0009627 A1* | 1/2015 | Dunn ................ | G02F 1/133382 361/695 |
| 2015/0017905 A1* | 1/2015 | Li ...................... | H05K 7/20163 454/184 |
| 2015/0237761 A1* | 8/2015 | Dunn .................. | H05K 7/20972 362/97.3 |
| 2015/0250067 A1* | 9/2015 | Gaddam ............. | H05K 5/0213 40/541 |
| 2018/0027672 A1* | 1/2018 | Cho ..................... | H05K 5/0017 361/697 |
| 2018/0164042 A1* | 6/2018 | Stellman .................. | C25D 5/10 |
| 2018/0352676 A1* | 12/2018 | Degner .............. | H05K 7/20154 |
| 2020/0381337 A1* | 12/2020 | Ghioni ................. | H01L 23/427 |
| 2021/0033916 A1* | 2/2021 | Uchimi .................. | G09G 3/36 |
| 2021/0173443 A1* | 6/2021 | Kulkarni ............ | H05K 7/20145 |
| 2021/0173456 A1* | 6/2021 | Kulkarni ............ | H05K 7/20172 |
| 2021/0176902 A1* | 6/2021 | Lee .................. | G02F 1/133385 |
| 2022/0110227 A1* | 4/2022 | Brown .............. | H05K 7/20145 |

* cited by examiner

INTERNAL COMPONENT ARCHITECTURE FOR A DISPLAY

CROSS-REFERENCE TO RELATED APPLICATIONS

The present application claims the benefit of U.S. Provisional Application No. 63/182,722, entitled "INTERNAL COMPONENT ARCHITECTURE FOR A DISPLAY," filed Apr. 30, 2021, the content of which is incorporated herein by reference in its entirety for all purposes.

FIELD

The described embodiments relate generally to display devices. More particularly, the present embodiments relate to internal layout of various component within the display device.

BACKGROUND

Recent advances in computing devices, including stand-alone display devices, promote an enhanced user experience. For example, display resolution, graphics, and brightness continue to improve with newer electronic devices. This is due in part to improved processing speed of the display components, as well as increased processing frequency of the components of the standalone display device that drive the display components. Additionally, due in part to improved manufacturing methods and consumer desire for lightweight products, computing device structures (e.g., display housings) to be made thinner.

However, some of these enhancements can lead to issues. Upgraded features and components, while operating, can result in additional thermal energy (i.e., heat) generation within the computing device. Additional thermal energy can cause damage to, or reduce performance, of other components. As an example, the display component may include a backlit device that generates thermal energy that can not only impair the backlit device itself but other display modules (e.g., LCD module), which can lead to color non-uniformity. Other enhancements, such as power driving units, must be limited in terms of the number of ports and associated electrical specifications for the ports. Further, due in part to the relatively thin nature of the display housing of the computing device, the available material (e.g., metal) for thermal energy dissipation is less.

SUMMARY

This paper describes various embodiments that relate to embodiments of display devices and electronic devices.

In one aspect, a display device is described. The display device may include a housing that defines an internal volume. The housing may include a vent inlet. The display device may further include a display module coupled with the housing. The display device may further include a heat-generating component located in the internal volume. The display device may further include a fan assembly located in the internal volume and positioned between the vent inlet and the heat-generating component. In some embodiments, the heat-generating component is positioned between the vent inlet and the fan assembly. Further, in some embodiments, during operation the fan assembly drives air into the housing through the vent inlet and causes the air to flow along the heat-generating component.

In another aspect, a display device is described. The display device may include a housing that defines an internal volume. The housing may include a first sidewall that defines a vent inlet. The housing may further include a second sidewall that defines a vent outlet. The display device may further include a display module coupled with the housing. The display module may be configured to present visual information. The display device may further include a fan assembly located in the internal volume. The display device may further include heat-generating components located in the internal volume and positioned between the first sidewall and the fan assembly. In some embodiments, the fan assembly is configured to i) drive air into the vent inlet such that the air flows over the heat-generating components and ii) drive the air out of the vent outlet.

In another aspect, an electronic device is described. The electronic device may include a housing that defines an internal volume. The housing may include a vent inlet and a vent outlet. The electronic device may further include a heat-generating component located in the internal volume. The electronic device may further include a fan assembly located in the internal volume and configured to drive air into the housing through the vent inlet. In some embodiments, the heat-generating component is upstream with respect to the fan assembly and the vent outlet is downstream with respect to the fan assembly.

Other aspects and advantages of the invention will become apparent from the following detailed description taken in conjunction with the accompanying drawings which illustrate, by way of example, the principles of the described embodiments.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Figure 1:
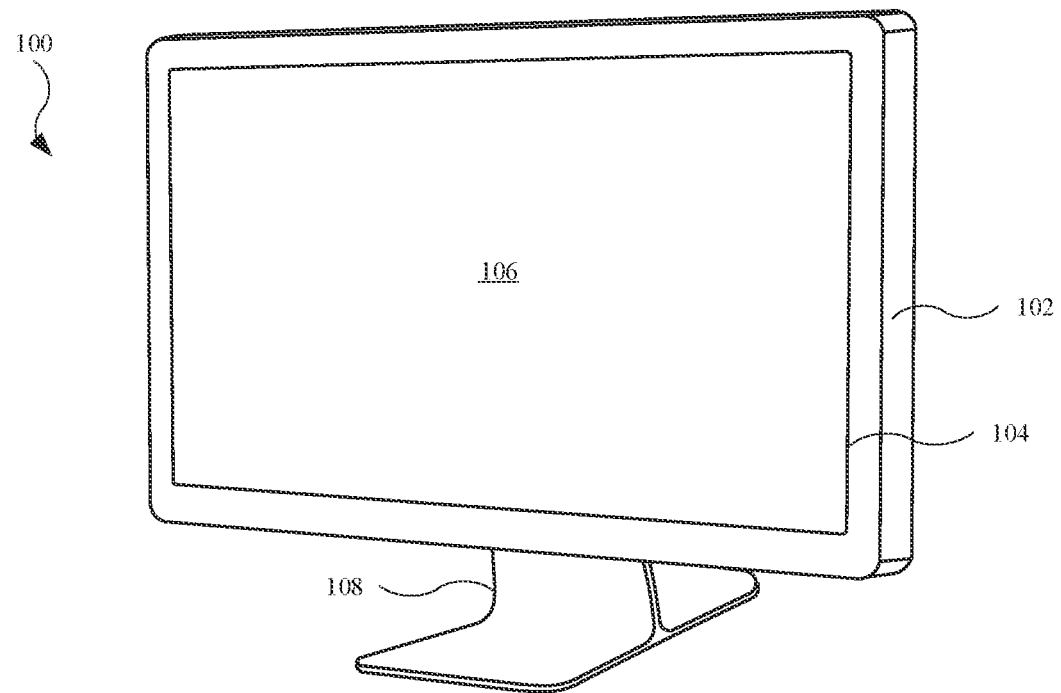
FIG. 1 illustrates a front isometric view of an electronic device, in accordance with some described embodiments.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

This application is directed to electronic devices (e.g., display devices, desktop devices with display, and the like), and the layout/architecture/arrangement of various internal components in the electronic devices. In particular, this application is directed to a layout that optimizes thermal performance and cools heat-generating components of the electronic device. Electronic devices described herein may include one or more fan assemblies, each of which is designed to drive ambient air into the electronic device to cool the heat-generating components (e.g., by convective cooling), and then drive the ambient air (once heated) out of the electronic device.

The fan assemblies, heat-generating components, and vents are strategically positioned to more efficiently cool the heat-generating components. For example, the vents can be arranged such that vent inlets are formed into one sidewall of a display housing of the electronic device, and the vent outlets are formed into another (opposing) sidewall of the display housing. Heat-generating components (e.g., backlit device such as a LED bar, power supply unit or PSU, integrated circuits on a main logic board) are positioned relatively closer to the vent inlet, which is used to receive the ambient air driven into the display housing. By positioning these heat-generating components closer to the vent inlet, the ambient air is typically at its lowest relative temperature, i.e., the ambient air will begin to increase in temperature while in the internal volume of the display housing. Additionally, some heat-generating components such as the backlit device are relatively long and span a substantial length within the internal volume. However, the vent inlet (which defines several through holes in the sidewall) can also be dispersed throughout the sidewall and collectively extend to the same or similar length as that of the backlit device. Additionally, the power supply unit is responsible for powering i) external electronic devices (e.g., desktop computers, laptop computers) used to drive a display module of the electronic device or ii) other devices including, but not limited to, mobile wireless communication devices (e.g., smartphones, tablet computing devices), headphones, and or another accessory device(s). The amount of power required by the power supply unit can be substantial, and thus, placing the power supply unit near the vent inlet can provide the benefit of receiving ambient air quickly and while it is relatively cool.

Additionally, the heat-generating components can be positioned between the fan assemblies and the vent inlet. In this manner, the heat-generating components are upstream relative to the fan assemblies. As a result, the fan assemblies, during operation, pull ambient air into the electronic device through the vent inlet such that the ambient air passes over or through the heat-generating components, thereby convectively cooling the heat-generating components prior to the ambient air (now heated) reaching a respective fan inlet of the fan assemblies. This may provide a better alternative as compared to cooling heated components (e.g., fin stacks) placed downstream relative to the fan assemblies.

The modification to the internal layout provides several benefits. For example, the electronic device can be made from materials having a thinner cross section, which may decrease the overall weight of the electronic device. Further, the overall form factor or footprint can be made smaller, as the heat-generating components can be cooled more efficiently. As a result, the display module can be positioned closer to the heat-generating components without affecting the performance of the display module.

These and other embodiments are discussed below with reference to FIGS. 1-12. However, those skilled in the art will readily appreciate that the detailed description given herein with respect to these figures is for explanatory purposes only and should not be construed as limiting.

FIG. 1 illustrates a front isometric view of an embodiment of an electronic device 100. In some embodiments, electronic device 100 is a desktop computing device. In the embodiment shown in FIG. 1, electronic device 100 is a standalone display. As shown, electronic device 100 includes a housing 102, or enclosure or display housing, that provides an internal volume or space in which multiple components are disposed, such as processing circuits (integrated circuits, central processing units, graphics processing units), memory circuits, audio speakers, microphones, batteries, fan assemblies, and flexible circuitry to couple the components together. Additionally, as a standalone display, electronic device 100 can couple (e.g., communicatively, operatively, mechanically, and/or electrically) to another computing device, such as a desktop computing device, a laptop computing device, or a mobile wireless communication device (e.g., tablet computing device or smartphone).

Electronic device 100 may further include a display module 104 coupled with housing 102. Display module 104 may include a liquid crystal display or a light-emitting diode (including an organic light-emitting diode) display, as non-limiting examples. Display module 104 is designed to present visual information in the form of textual information, still images, and/or motion picture (video) images. Display module 104 may include a liquid crystal display ("LCD") or a light emitting diode ("LED") display. Electronic device 100 may further include a transparent layer 106 that covers display module 104. Transparent layer 106 may generally include any rigid transparent substrate, such as glass, plastic, or sapphire, as non-limiting examples.

In order to adjust the position of display module 104, electronic device 100 includes a stand 108 coupled with housing 102. Housing 102 and stand 108 can be rotationally coupled together, thereby allowing housing 102 (and display module 104) to rotate to different positions, based upon user preferences.

Figure 2:
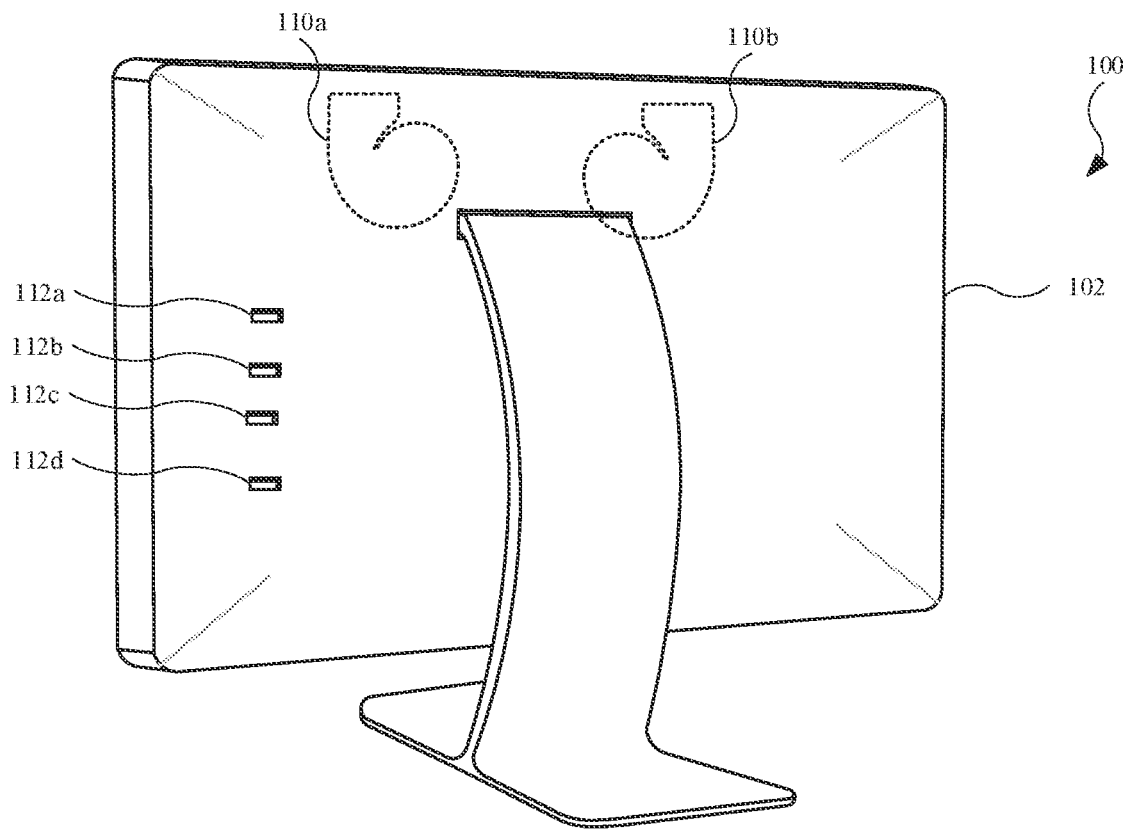
FIG. 2 illustrates a rear isometric view of the electronic device, showing additional features of the electronic device.

FIG. 2 illustrates a rear isometric view of electronic device 100 shown in FIG. 1, showing additional features of electronic device 100. As shown, electronic device 100 includes a fan assembly 110a and a fan assembly 110b. Fan assembly 110a and 110b may each include direct current ("DC") brushless motor fans, as a non-limiting example. Fan assemblies 110a and 110b are designed to drive air within the internal volume defined by housing 102. In this manner, fan assemblies 110a and 110b may cool (by convention) components within electronic device 100 that generate thermal energy during use and/or bodies designed to absorb thermal energy. In this regard, fan assemblies 110a and 110b, during operation, can force ambient air (external to electronic device 100) into housing 102, and subsequently drive the air (once heated) out of housing 102 in a desired manner. This will be shown and described further.

Additionally, electronic device 100 may include multiple ports. For example, the electronic device may include a port 112a, a port 112b, a port 112c, and a port 112d. Ports 112a-d are designed to provide a connection/communication point between electronic device 100 and other external devices (not shown in FIG. 2). Accordingly, each of 112a-d may include an industry standard connection, such as Universal Serial Bus ("USB"), including USB-C, connection or a THUNDERBOLT® connection, as non-limiting examples. In this regard, some of ports 112a-d can be used to connect to an electronic device that drives display module 104, while some of ports 112a-d can be used to connect to electronic devices that receive power from (i.e., charges) the electronic devices.

Figure 3:
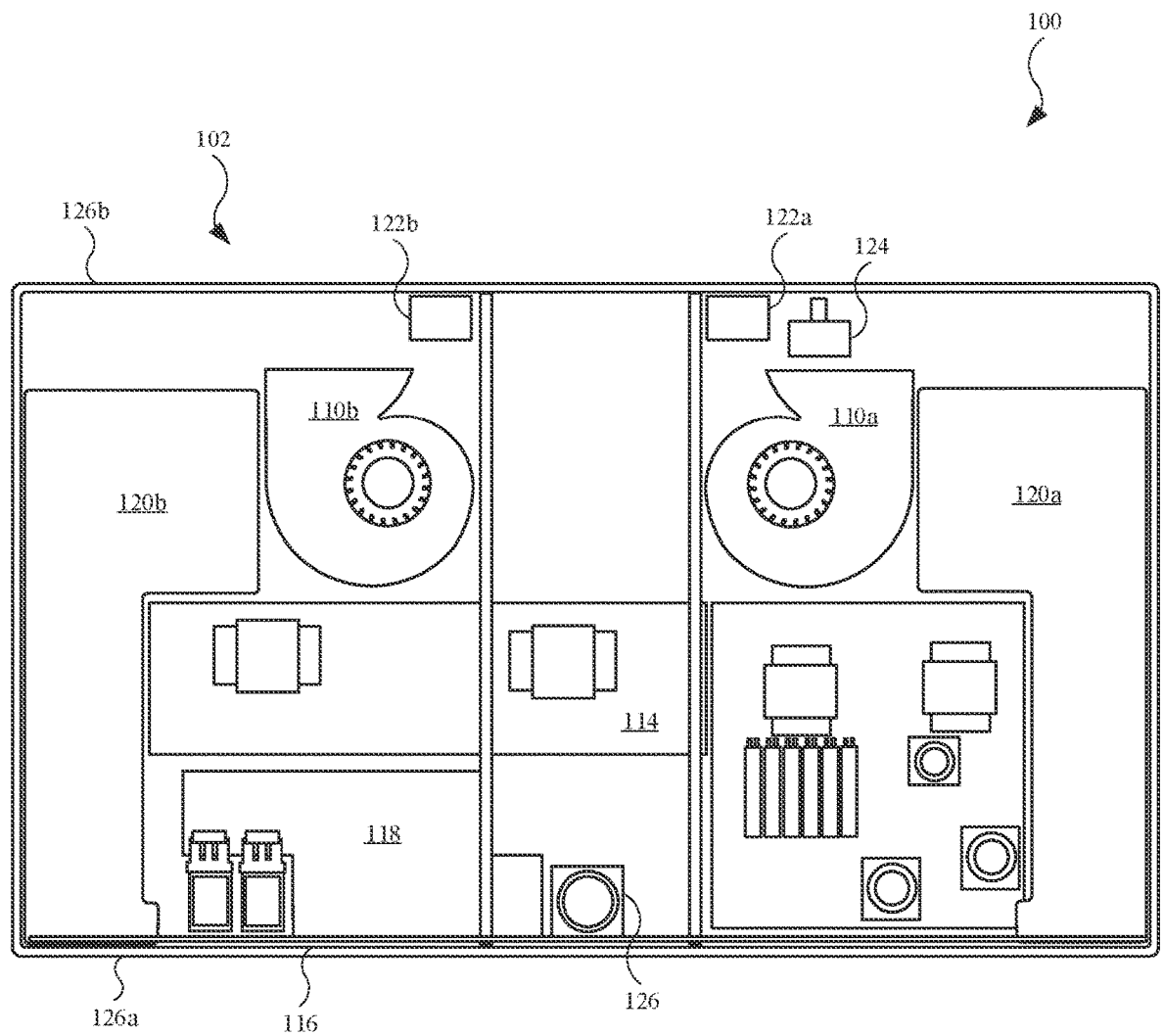
FIG. 3 illustrates a plan view of the electronic device, showing an internal layout of various components of the electronic device.

FIG. 3 illustrates a plan view of electronic device 100, showing an internal layout of various components of electronic device 100. For purposes of illustration, display module 104 and transparent layer 106 are removed. As shown, housing 102 defines an internal volume to hold and carry several components of electronic device 100. In addition to fan assemblies 110a and 110b, housing 102 holds a power supply unit 114 designed to distribute power to various internal components as well as the aforementioned external devices that are electrically connected to ports 112a-d (shown in FIG. 2). Also, housing 102 holds a backlit device 116. In some embodiments, backlit device 116 includes an LED bar used to provide additional lighting to display module 104 (shown in FIG. 1). Housing 102 further holds a circuit board 118. In some embodiments, circuit board 118 is a main logic board ("MLB") that carries several processing circuits, memory circuits, and other operational components (not labeled) used to operate display module 104, fan assemblies 110a and 110b, power supply unit 114, backlit device 116 and other internal components discussed below.

Housing 102 may further hold audio speakers, such as an audio speaker 120a and an audio speaker 120b. Audio speakers 120a and 120b may include stereo speakers that provide acoustic energy in the form of audible sound. Additionally, housing 102 may hold a spatial audio speaker 122a and a spatial audio speaker 122b. Spatial audio speakers 122a and 122b are designed to produce audio effects such as a surround sound (as a non-limiting example). Additionally, housing 102 may hold a timing control board 124, or TCON board. Timing control board 124 is designed to control a logic signal of gate and source for driving thin-film transistors ("TFT") in display module 104. Further, electronic device 100 may include a power cord 126 designed to plug into an external source (not shown in FIG. 3) to supply power to electronic device 100 and its components. Power cord 126 may include a semi-tethered alternating current ("AC") power cord. Accordingly, power cord 126 may be removable and replaceable by a different cord that conforms to a different industry standard.

Also, electronic device 100 may further include several vents. Although not shown in FIG. 3, the vents can be formed into sidewalls, such as a sidewall 126a and a sidewall 126b, of housing 102. This will be shown and described below.

Figure 4A:
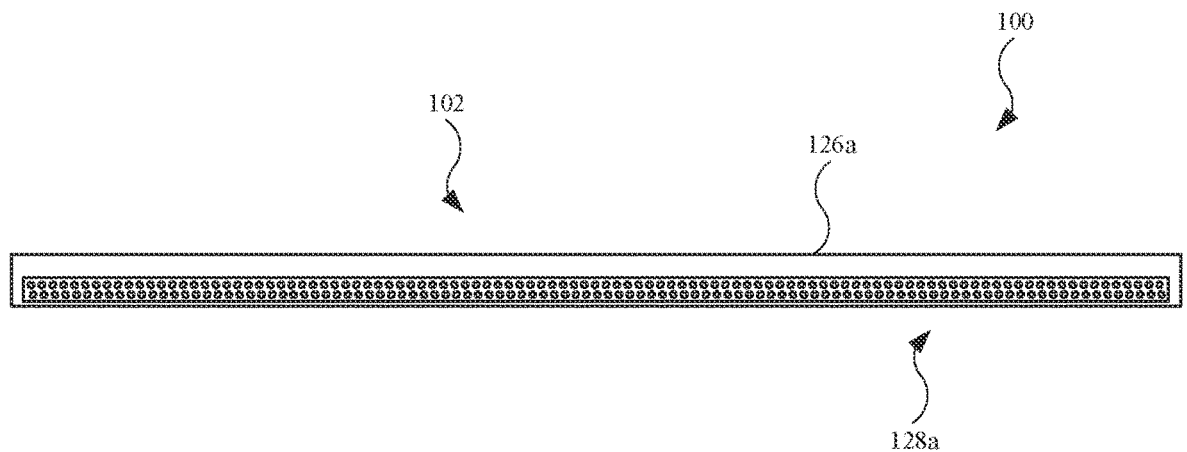
FIGS. 4A and 4B illustrate a plan view of the electronic device, showing vents at different locations of the electronic device.
Figure 4B:
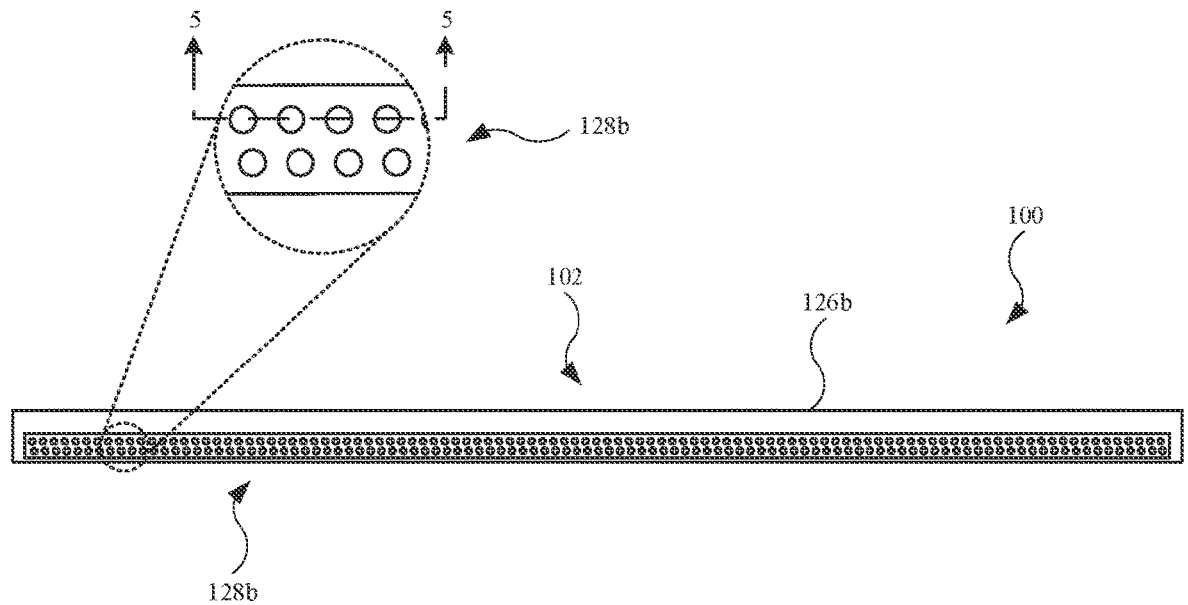

FIGS. 4A and 4B illustrate a plan view of electronic device 100, showing vents at different locations of electronic device 100. FIG. 4A illustrates sidewall 126a of housing 102. Based on its relative position (as shown in FIG. 3), sidewall 126a may be referred to as a lower sidewall. As shown, sidewall 126a includes a vent inlet 128a defined by several openings, or through holes, formed in sidewall 126a. Collectively, vent inlet 128a spans substantially across a length of sidewall 126a, thereby allowing a substantial region for ambient air to enter housing 102 when fan assemblies 110a and 110b (shown in FIG. 3) are operating. Moreover, vent inlet 128a may span (collectively by the openings) a length corresponds to, or substantially corresponds to, a length of backlit device 116. As a result, ambient air entering vent inlet 128a can virtually reach most surfaces of backlit device 116 quickly and efficiently when fan assemblies 110a and 110b are operating.

FIG. 4B illustrates sidewall 126b of housing 102. Based on its relative position (as shown in FIG. 3), sidewall 126b may be referred to as an upper sidewall. As shown, sidewall 126b includes a vent outlet 128b defined by several openings, or through holes, formed in sidewall 126b. Collectively, vent outlet 128b spans substantially across a length of sidewall 126b, thereby allowing a substantial region for ambient air, now heated air, to exit housing 102 when fan assemblies 110a and 110b (shown in FIG. 3) are operating. Moreover, due to the substantial disbursement of its openings, vent outlet 128b allowed the heated air to disburse substantially along the length of sidewall 126b, thereby eliminating or reducing heated air from leaving a concentered (i.e., relatively small) location. As a result, heated air leaving vent outlet 128b is less likely to create "hot spots" (i.e., concentrations of thermal energy) and cause injury to a user.

Figure 5:
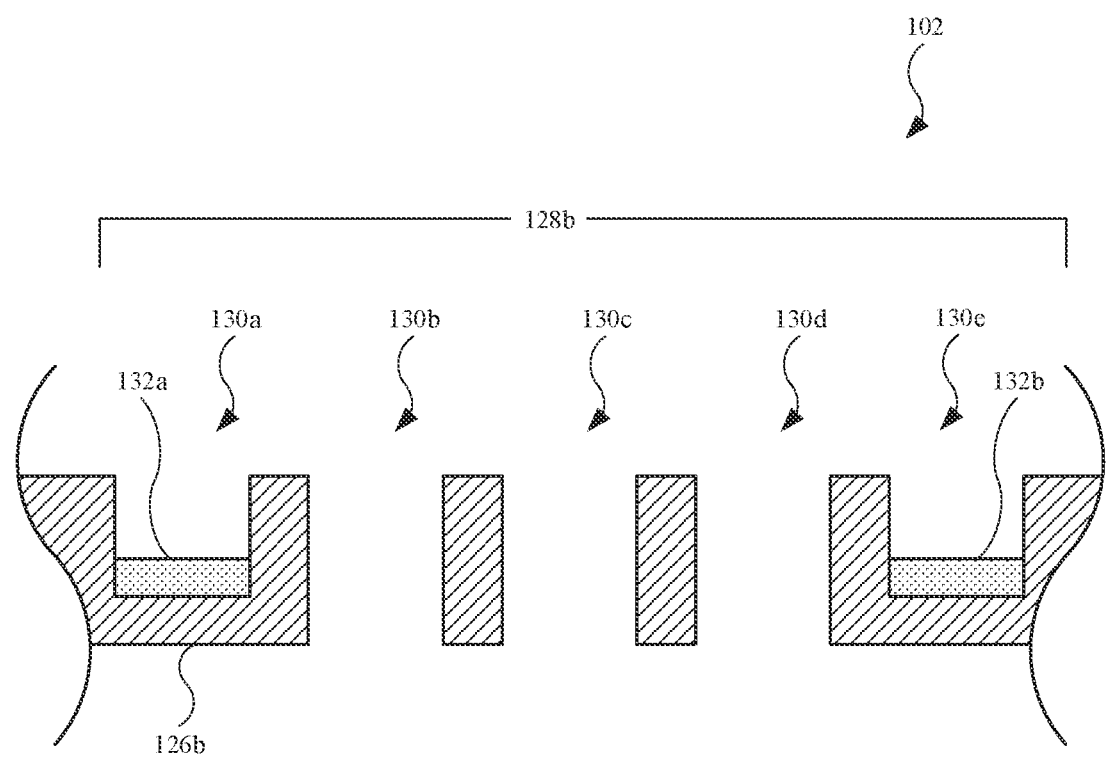
FIG. 5 illustrates a cross sectional view of the housing shown in FIG. 4B taken along line 5-5, showing the openings of the housing.

FIG. 5 illustrates a cross sectional view of housing 102 shown in FIG. 4B taken along line 5-5, showing the openings of housing 102. As shown, vent outlet 128b including openings 130a-130e (representative of additional openings). Some openings are through holes that pass completely through sidewall 126b, while others are blind holes that pass only partially through. For example, openings 130b-d are through holes, and accordingly, ambient air can leave vent outlet 128b via openings 130b-d, openings 130a and 130e are blind holes, and accordingly, ambient air does not pass through openings 130a and 130e. Regarding the latter, in order to create an appearance of a through hole, openings 130a and 130e are filled with a material 132a and a material 132b, respectively. Materials 132a and 132b may include an ink with a dark (e.g., black) appearance. It should be noted that in some embodiments, openings of vent outlet 128b are through holes. Also, vent inlet 128a (shown in FIG. 4A) may include any features shown and described for vent outlet 128b.

Figure 6:
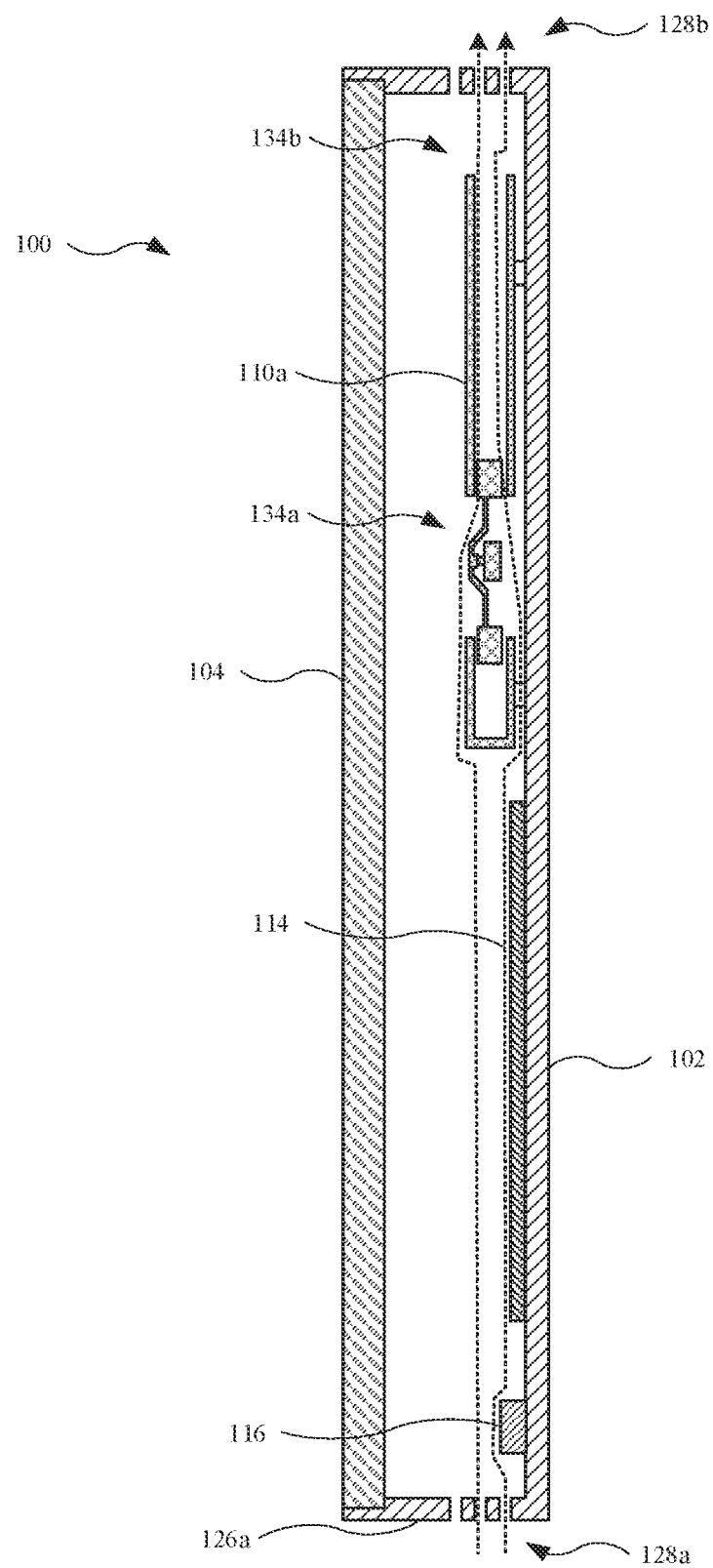
FIG. 6 illustrates a cross sectional view of the electronic device, showing an exemplary air flow movement through the electronic device.

FIG. 6 illustrates a cross sectional view of electronic device 100, showing an exemplary air flow movement through electronic device 100. The air flow passing into, passing through, and passing out of electronic device 100 (including through the internal volume defined by housing 102) is represented by dotted lines. As shown, fan assembly 110a is operating, and driving into electronic device 100. The air flows over and past backlit device 116 to convectively cool backlit device 116. Moreover, based upon the location of backlit device 116 being relatively close to sidewall 126a, and in turn vent inlet 128a, the ambient air is at its lowest temperature when entering electronic device 100, and as a result, the likelihood of efficiently cooling backlit device 116 is increased. Also, the ambient air flows over and past power supply unit 114 to convectively cool power supply unit 114. It should be noted that fan assembly 110b (shown in FIG. 3) operates in a manner similar to that of fan assembly 110a, and can also cause air to pass over and past backlit device 116, power supply unit 114, and circuit board 118 (shown in FIG. 3).

Referring again to FIG. 3 (and in view of FIG. 6), power supply unit 114, backlit device 116, and circuit board 118 are also positioned at a lower half (approximately) in housing 102, and accordingly, are relatively closer to vent inlet 128a. Also, the air induced into housing 102 by fan assembly 110a (and fan assembly 110b) reaches power supply unit 114, backlit device 116, and circuit board 118 prior to entering a fan inlet 134a of fan assembly 110a (and a respective fan inlet of fan assembly 110b), and accordingly, power supply unit 114, backlit device 116, and circuit board 118 are upstream relative to fan assembly 110a (and fan assembly 110b). Also, as shown, fan assembly 110a ejects the air, now heated, out of a fan outlet 134b of fan assembly 110a and through vent outlet 128b.

Figure 7:
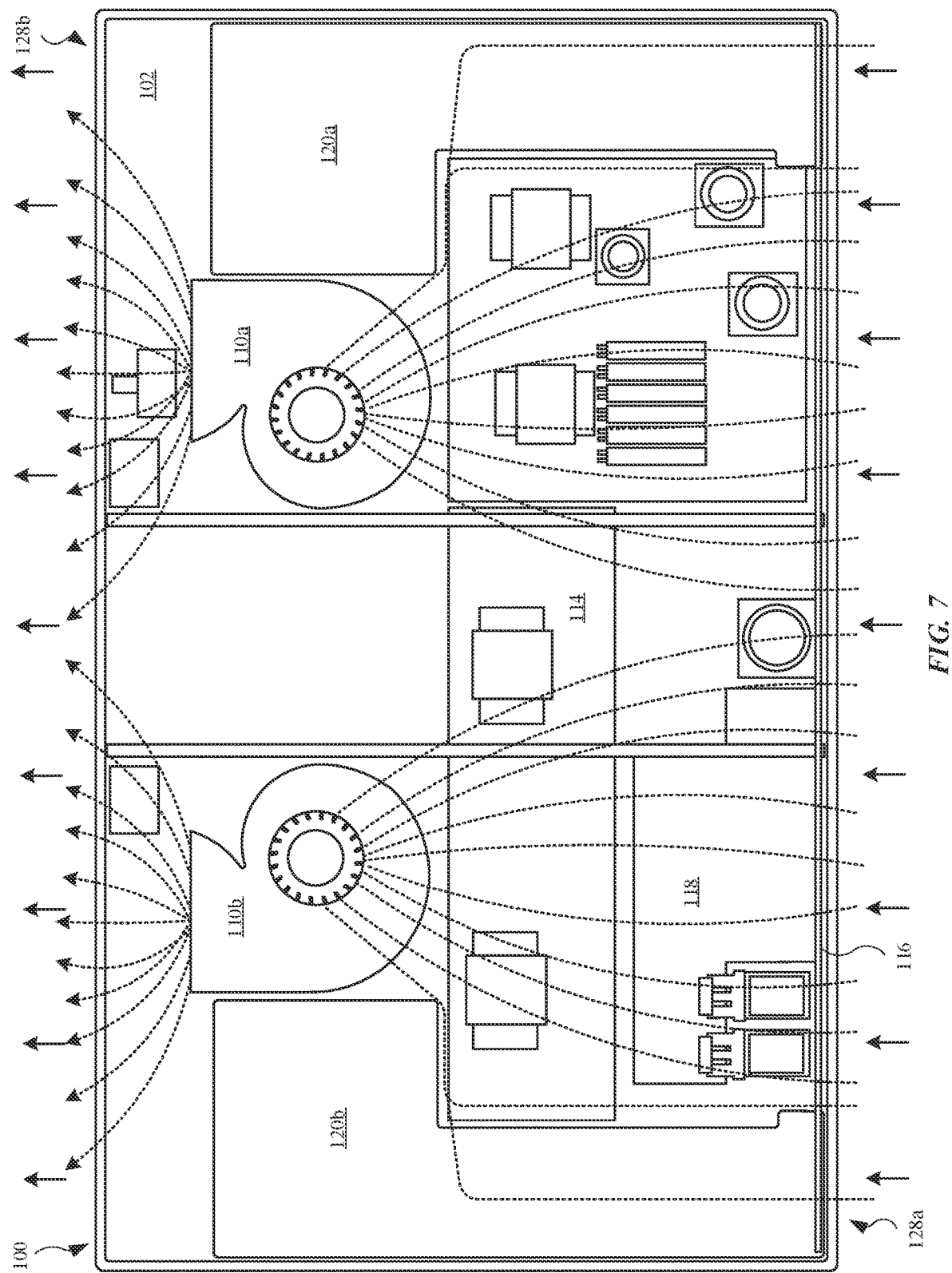
FIG. 7 illustrates a plan view of the electronic device, showing air flow through the inlet and outlet vents of the housing.

FIG. 7 illustrates a plan view of electronic device 100, showing air flow through the inlet and outlet vents of the housing 102. The air flow passing into, passing through, and passing out of electronic device 100 (including through the internal volume defined by housing 102) is represented by solid and dotted lines. During operation, fan assemblies 110a and 110b drive ambient air into housing 102, causing the ambient air to flow over and past power supply unit 114, backlit device 116, and circuit board 118. Further, based upon the layout of vent inlet 128a (also shown in FIG. 4A), the ambient air substantially passes over and past backlit device 116, thereby allowing backlit device 116 to be efficiently cooled. Similarly, the area covered by the ambient air can efficiently cool power supply unit 114 and circuit board 118. Also, audio speakers 120a and 120b may act as a baffle, or guide, to direct the air within housing 102, which may increase cooling efficiency by directing the air to places of higher temperatures. Further, as air flow is driven out of fan assemblies 110a and 110b, fan assemblies 110a and 110b disburse the heated air throughout vent outlet 128b in a relatively even manner so as to limit or prevent hot spots. Based on the layout, the internal components of electronic device 100 as well as display module 104 (shown in FIG. 1), can be operable while remaining at or below their specified temperatures of operation. Regarding display module 104, it should be apparent that the air flowing through housing 102 can also draw thermal energy from display module 104, thereby convectively cooling display module 104.

FIGS. 8-11 show and describe alternate embodiments of electronic devices. While some features vary in these embodiments and some features are not described in detail, the electronic device shown and described in FIGS. 8-11 may include several, if not all, features shown and described for electronic device 100.

Figure 8:
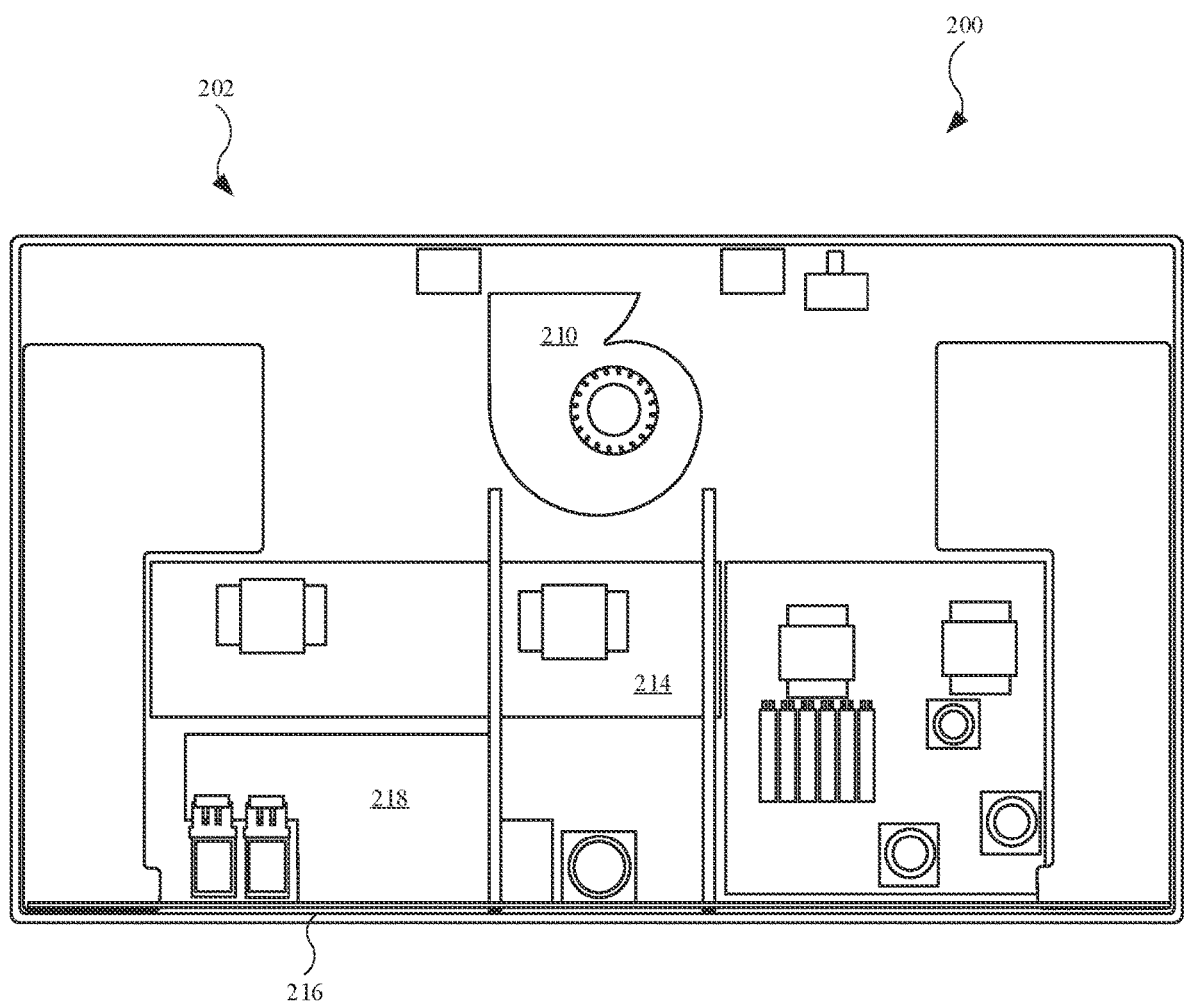
FIG. 8 illustrates a plan view of an alternate embodiment of an electronic device, showing a single fan assembly used to drive air flow through the electronic device.

FIG. 8 illustrates a plan view of an alternate embodiment of an electronic device 200, showing a single fan assembly used to drive air flow through electronic device 200. As shown, electronic device 200 includes a fan assembly 210, representing a single fan in a housing 202 of electronic device 200. Fan assembly 210 may be used to cool internal components, such as a power supply unit 214, a backlit device 216, and a circuit board 218.

Figure 9:
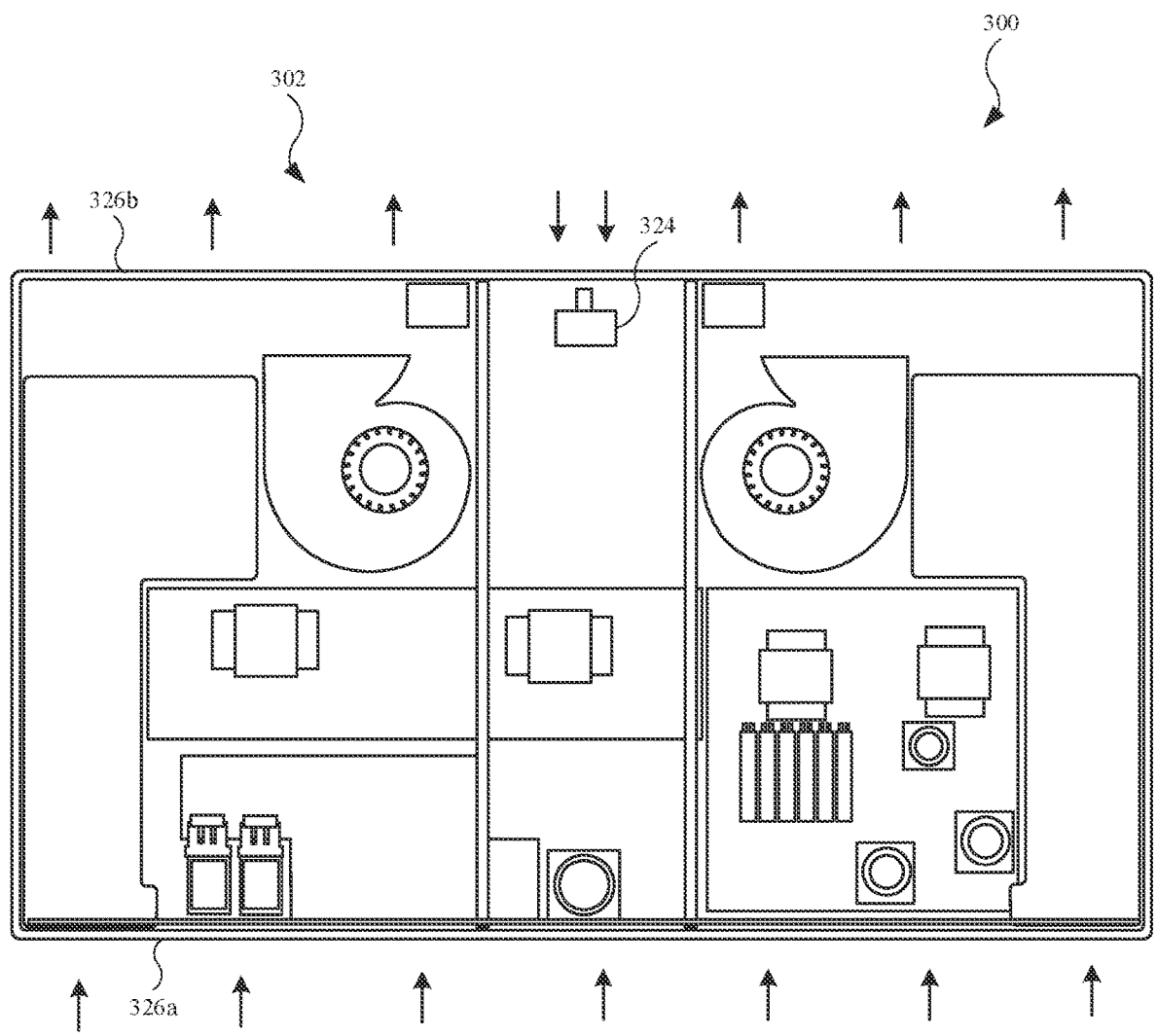
FIG. 9 illustrates a plan view of an alternate embodiment of an electronic device, showing a different location for a timing controller and associated modifications for the timing controller.

FIG. 9 illustrates a plan view of an alternate embodiment of an electronic device 300, showing a different location for a timing controller 324 and associated modifications for timing controller 324. As shown, electronic device 300 includes a housing 302 that includes several components, including timing controller 324. While the timing controller was offset to one location in prior embodiments, timing controller 324 is centered, or at least substantially centered, in housing 302. Also, housing 302 includes a sidewall 326a and a sidewall 326b. The arrows directed toward sidewall 326a represent the direction of ambient air that can flow through a vent inlet (not shown in FIG. 9) of sidewall 326a, and arrows directed away from sidewall 326b represent the direction of heated ambient air can flow through a vent outlet (not shown in FIG. 9) of sidewall 326b. Further, arrows directed toward sidewall 326b represent the direction of ambient air that can flow through a vent inlet (not shown in FIG. 9) of sidewall 326b. In this manner, sidewall 326b may include openings for both a vent inlet and outlet, with the former being used to cool timing controller 324.

Figure 10:
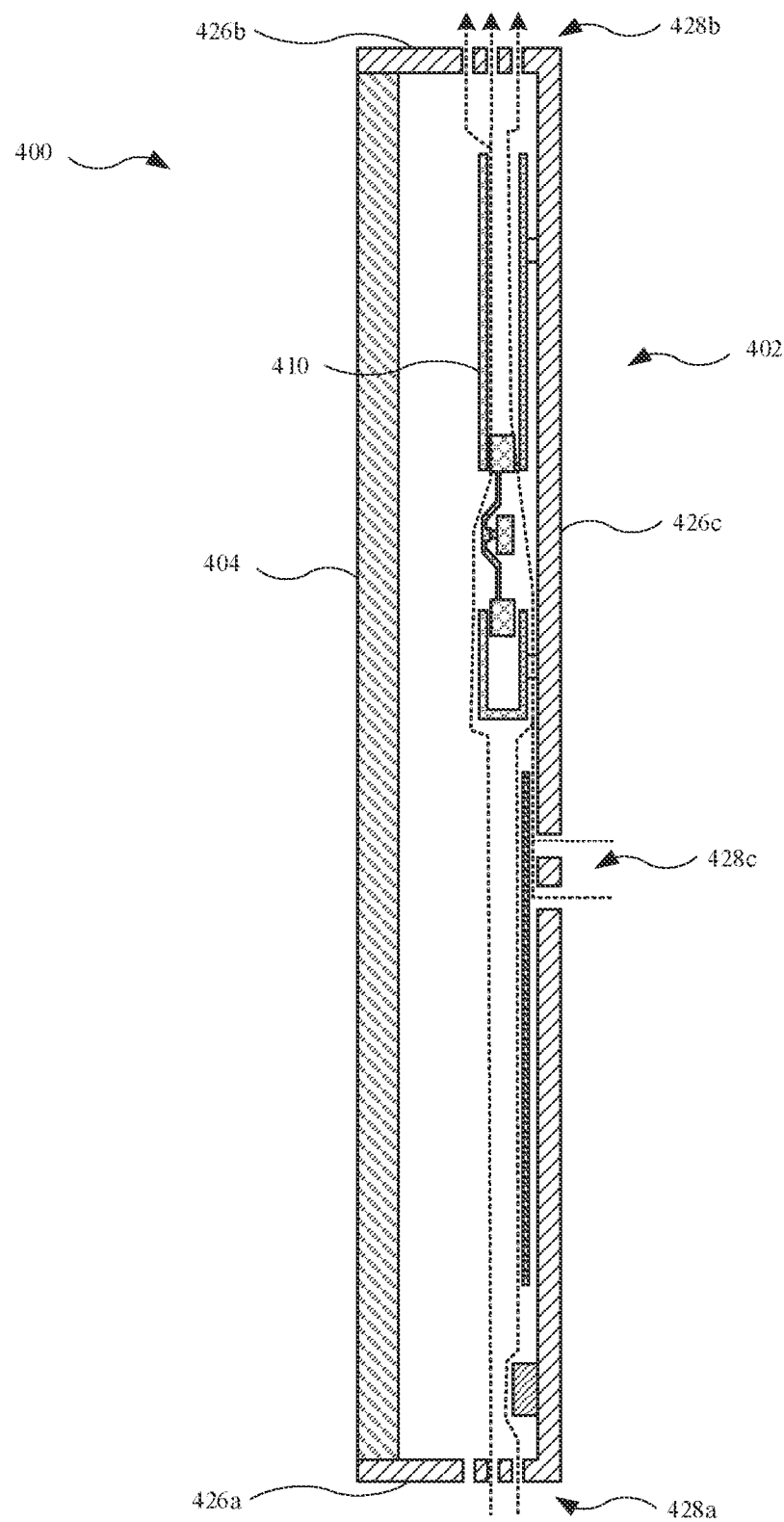
FIG. 10 illustrates a cross sectional view of an alternate embodiment of an electronic device, showing additional vent inlets.

FIG. 10 illustrates a cross sectional view of an alternate embodiment of an electronic device 400, showing additional vent inlets. As shown, electronic device 400 includes a housing 402 and a display module 404 coupled with housing 402. Also, a fan assembly 410 (representative of one or more fan assemblies) is located in housing 402. The air flow (driven by fan assembly 410) passing into, passing through, and passing out of electronic device 400 (including through the internal volume defined by a housing 402) is represented by solid and dotted lines. As shown, housing 402 includes a sidewall 426a, a sidewall 426b, and a back wall 426c between sidewalls 426a and 426b. Each of sidewalls 426a and 426b, as well as back wall 426c, include vent openings. For example, sidewalls 426a and 426b include a vent inlet 428a and a vent outlet 428b, while back wall 426c includes a vent inlet 428c. Using vent inlet 428c at back wall 426c, fan assembly 410 can draw additional ambient air in, and at a different location of electronic device 400. This may further increase cooling efficiency.

Figure 11:
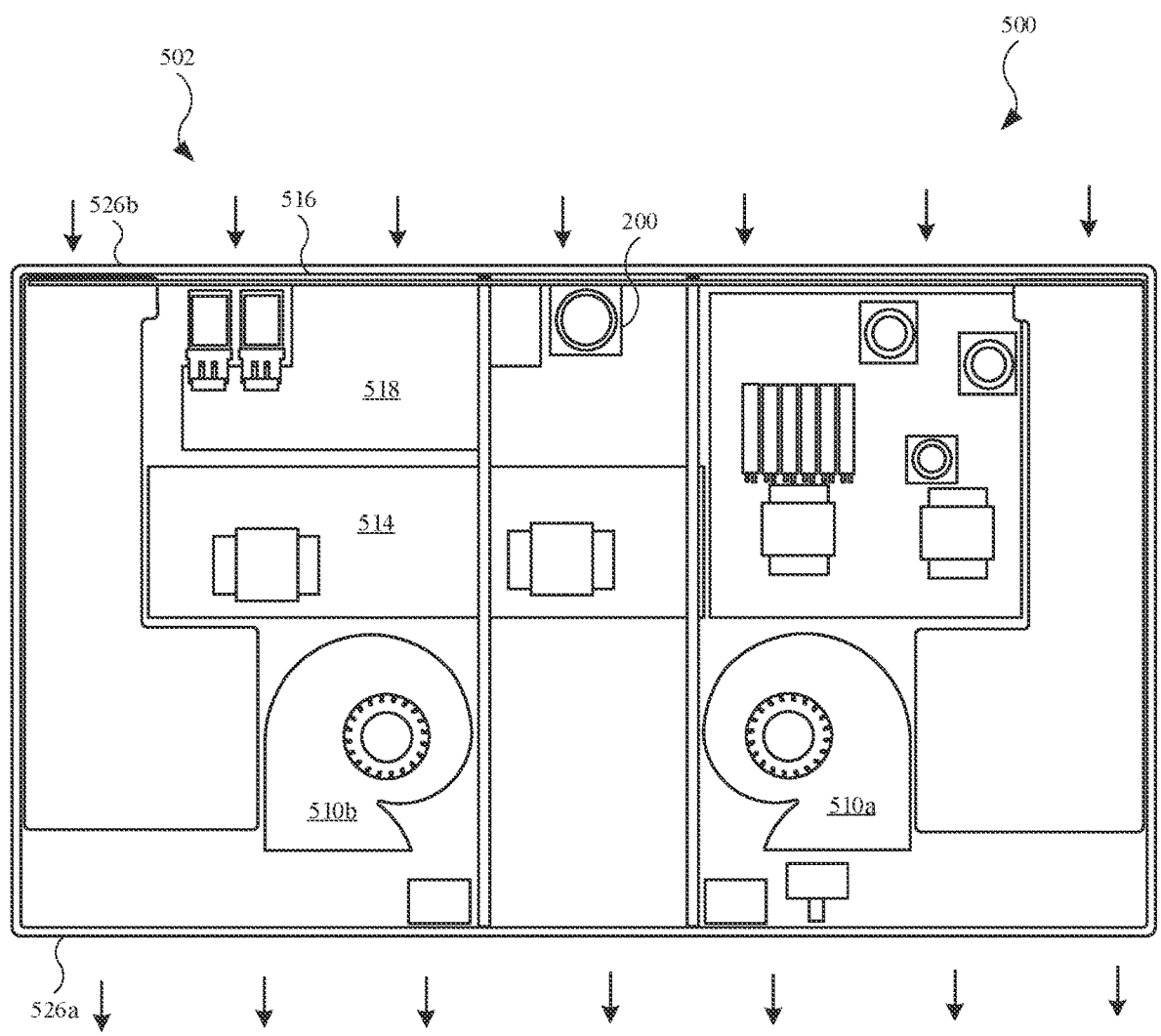
FIG. 11 illustrates a plan view of an alternate embodiment of an electronic device, showing a different internal layout of components.

FIG. 11 illustrates a plan view of an alternate embodiment of an electronic device 500, showing a different internal layout of components. As shown, electronic device 500 includes a housing 502 that carries several components, including a fan assembly 510a, a fan assembly 510b, a power supply unit 514, a backlit device 516, and a circuit board 518. Electronic device 500 generally represents an "inverted" version of electronic device 100 (shown in FIG. 1). Accordingly, when fan assemblies 510a and 510b are operating, ambient air may enter a sidewall 526b (through a vent inlet, not shown, of sidewall 526b) and exit a sidewall 526a (through a vent outlet, not shown, of sidewall 526a). Unlike prior embodiments, the ambient air enters through a vent inlet in an upper sidewall (i.e., sidewall 526b) and exits through a vent outlet in a lower sidewall (i.e., sidewall 526a). However, power supply unit 514, backlit device 516, and circuit board 518 still remain upstream relative to fan assemblies 510a and 510b.

Figure 12:
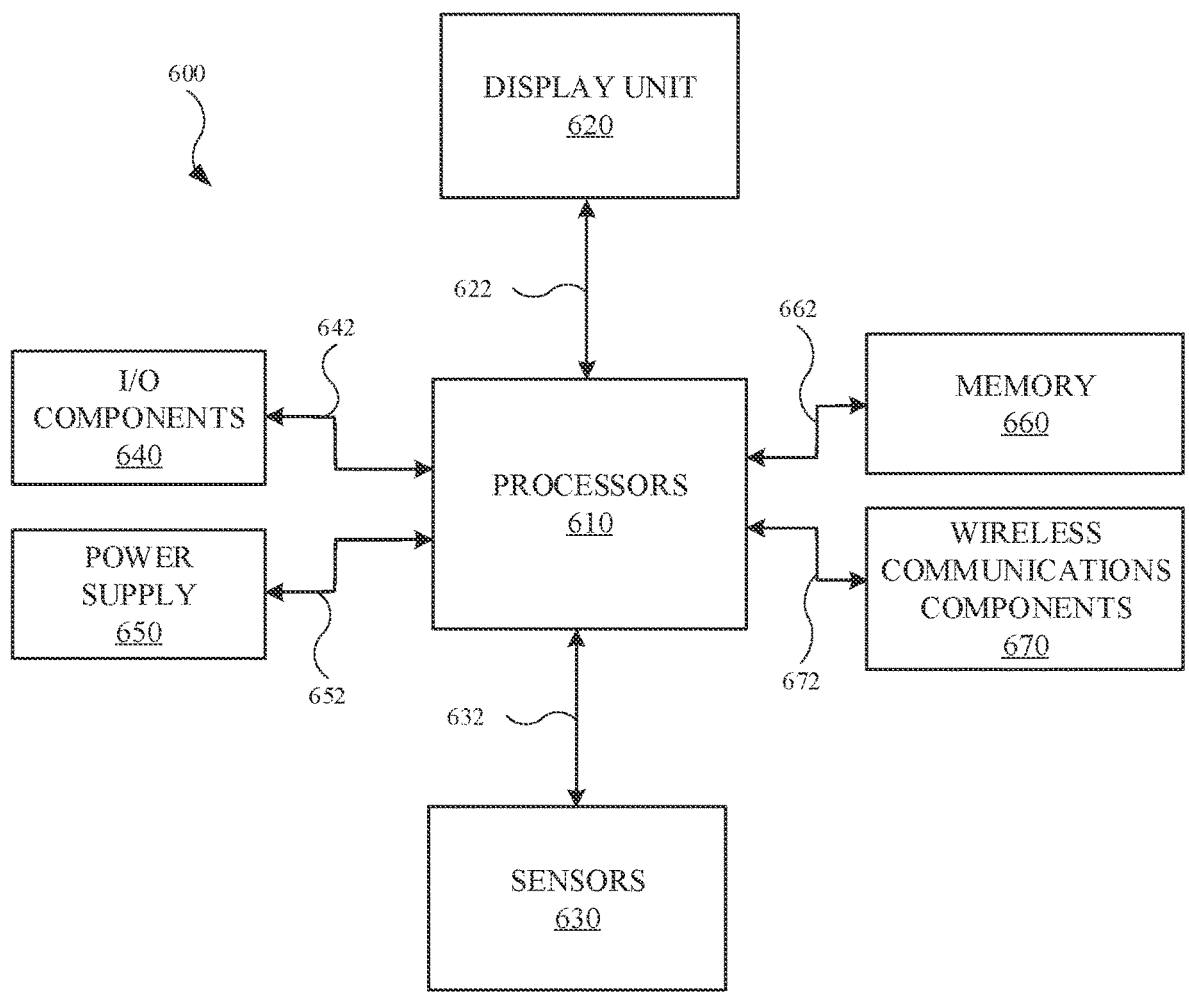
FIG. 12 illustrates a block diagram of an electronic device, in accordance with some described embodiments.

FIG. 12 illustrates a block diagram of an electronic device 600, in accordance with some described embodiments. The features in electronic device 600 may be present in other electronic devices described herein. Electronic device 600 may include one or more processors 610 for executing functions of the electronic device 600. One or more processors 610 can refer to at least one of a central processing unit (CPU) and at least one microcontroller for performing dedicated functions. Also, one or more processors 610 can refer to application specific integrated circuits.

According to some embodiments, electronic device 600 can include a display unit 620. Display unit 620 is capable of presenting a user interface that includes icons (representing software applications), textual images, and/or motion images. In some examples, each icon can be associated with a respective function that can be executed by one or more processors 610. In some cases, display unit 620 includes a display layer (not illustrated), which can include a liquid-crystal display (LCD), light-emitting diode display (LED), or the like. According to some embodiments, display unit 620 includes a touch input detection component and/or a force detection component that can be configured to detect changes in an electrical parameter (e.g., electrical capacitance value) when the user's appendage (acting as a capacitor) comes into proximity with display unit 620 (or in contact with a transparent layer that covers the display unit 620). Display, unit 620 is connected to one or more processors 610 via one or more connection cables 622.

According to some embodiments, electronic device 600 can include one or more sensors 630 capable of provide an input to one or more processors 610 of electronic device 600. One or more sensors 630 may include a temperature sensor, a capacitive sensor, and magnetic field sensors, as a non-limiting example. One or more sensors 630 is/are connected to one or more processors 610 via one or more connection cables 632.

According to some embodiments, electronic device 600 can include one or more input/output components 640. In some cases, the one or more input/output components 640 can refer to a button or a switch that is capable of actuation by the user. When one or more input/output components 640 are used, one or more input/output components 640 can generate an electrical signal that is provided to one or more processors 610 via one or more connection cables 642.

According to some embodiments, electronic device 600 can include a power supply 650 that is capable of providing energy to the operational components of electronic device 600. In some examples, power supply 650 can refer to a rechargeable battery. Power supply 650 can be connected to one or more processors 610 via one or more connection cables 652. The power supply 650 can be directly connected to other devices of electronic device 600, such as one or more input/output components 640. In some examples, electronic device 600 can receive power from another power source (e.g., an external charging device).

According to some embodiments, the electronic device 600 can include memory 660, which can include a single disk or multiple disks (e.g., hard drives), and includes a storage management module that manages one or more partitions within memory 660. In some cases, memory 660 can include flash memory, semiconductor (solid state) memory or the like. Memory 660 can also include a Random Access Memory ("RAM") and a Read-Only Memory ("ROM"). The ROM can store programs, utilities or processes to be executed in a non-volatile manner. The RAM can provide volatile data storage, and stores instructions related to the operation of the electronic device 600. In some embodiments, memory 660 refers to a non-transitory computer readable medium. One or more processors 610 can also be used to execute software applications. In some embodiments, a data bus 662 can facilitate data transfer between memory 660 and one or more processors 610.

According to some embodiments, electronic device 600 can include wireless communications components 670. A network/bus interface 672 can couple wireless communications components 670 to one or more processors 610. Wireless communications components 670 can communicate with other electronic devices via any number of wireless communication protocols, including at least one of a global network (e.g., the Internet), a wide area network, a local area network, a wireless personal area network (WPAN), or the like. In some examples, the wireless communications components 670 can communicate using NFC protocol, BLUETOOTH® protocol, or WIFI® protocol.

In accordance with various embodiments described herein, the terms "wireless communication device," "wireless device," "mobile device," "mobile station," and "user equipment" (UE) may be used interchangeably herein to describe one or more common consumer electronic devices that may be capable of performing procedures associated with various embodiments of the disclosure. In accordance with various implementations, any one of these consumer electronic devices may relate to: a cellular phone or a smart phone, a tablet computer, a laptop computer, a notebook computer, a personal computer, a netbook computer, a media player device, an electronic book device, a MiFi® device, a wearable computing device, as well as any other type of electronic computing device having wireless communication capability that can include communication via one or more wireless communication protocols such as used for communication on: a wireless wide area network (WWAN), a wireless metro area network (WMAN) a wireless local area network (WLAN), a wireless personal area network (WPAN), a near field communication (NFC), a cellular wireless network, a fourth generation (4G) LTE, LTE Advanced (LTE-A), and/or 5G or other present or future developed advanced cellular wireless networks.

The wireless communication device, in some embodiments, can also operate as part of a wireless communication system, which can include a set of client devices, which can also be referred to as stations, client wireless devices, or client wireless communication devices, interconnected to an access point (AP), e.g., as part of a WLAN, and/or to each other, e.g., as part of a WPAN and/or an "ad hoc" wireless network. In some embodiments, the client device can be any wireless communication device that is capable of communicating via a WLAN technology, e.g., in accordance with a wireless local area network communication protocol. In some embodiments, the WLAN technology can include a Wi-Fi (or more generically a WLAN) wireless communication subsystem or radio, the Wi-Fi radio can implement an Institute of Electrical and Electronics Engineers (IEEE) 802.11 technology, such as one or more of: IEEE 802.11a; IEEE 802.11b; IEEE 802.11g; IEEE 802.11-2007; IEEE 802.11n; IEEE 802.11-2012; IEEE 802.11ac; or other present or future developed IEEE 802.11 technologies.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a non-transitory computer readable medium. The non-transitory computer readable medium is any data storage device that can store data which can thereafter be read by a computer system. Examples of the non-transitory computer readable medium include read-only memory, random-access memory, CD-ROMs, HDDs, DVDs, magnetic tape, and optical data storage devices. The non-transitory computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. A display device, comprising:
a housing that defines an internal volume, the housing comprising:
a first sidewall comprising a vent inlet, and
a second sidewall opposite the first sidewall;
a display module coupled with the housing at the first sidewall and at the second sidewall;
a heat-generating component located in the internal volume;
a fan assembly located in the internal volume, the fan assembly comprising a fan outlet facing the second sidewall, wherein the heat-generating component is positioned between the vent inlet and the fan assembly, and during operation the fan assembly drives air into the housing through the vent inlet and causes the air to flow along the heat-generating component;
a first audio speaker;
a second audio speaker; and
a second fan assembly, wherein the fan assembly and the second fan assembly are located between the first audio speaker and the second audio speaker.

2. The display device of claim 1, wherein:
the housing further comprises a vent outlet, and
the air is driven by the fan assembly through the vent outlet.

3. The display device of claim 2, wherein:
the vent inlet comprises a first plurality of openings formed into the first sidewall, and
the vent outlet comprises a second plurality of openings formed into the second sidewall.

4. The display device of claim 1, wherein the heat-generating component comprises i) a power supply unit configured to provide power to devices external to the housing or ii) a backlit device.

5. The display device of claim 1,
wherein the first audio speaker or the second audio speaker directs the air toward the fan assembly.

6. The display device of claim 1, further comprising a stand rotationally connected to the housing.

7. The electronic device of claim 1, wherein the heat-generating component is located upstream with respect to the fan assembly.

8. A display device, comprising:
a housing that defines an internal volume, the housing comprising:
a first sidewall that defines a vent inlet,
a second sidewall that defines a vent outlet;
a display module coupled with the housing, the display module configured to present visual information;
a fan assembly located in the internal volume between the first sidewall and the second sidewall;
heat-generating components located in the internal volume and upstream with respect to the fan assembly, the heat-generating components positioned between the first sidewall and the fan assembly, wherein:
the fan assembly is configured to i) drive air into the vent inlet causing the air flows over the heat-generating components and ii) drive the air out of the vent outlet; and
an audio speaker positioned in the internal volume to direct the air toward the fan assembly.

9. The display device of claim 8, wherein the fan assembly convectively cools the heat-generating components.

10. The display device of claim 8, wherein the heat-generating components comprise:
a backlit device; and
a power supply unit configured to provide power to devices external to the housing.

11. The display device of claim 10, wherein the power supply unit is configured to power:
an electronic device that drives the display module; and
an accessory device, wherein the electronic device and the accessory device are external relative to the housing.

12. The display device of claim 8, wherein the fan assembly:
comprises a fan inlet, and
causes the air to pass over the heat-generating components prior to the air passing through the fan inlet.

13. The display device of claim 8, further comprising:
a second audio speaker positioned in the internal volume to direct the air toward the fan assembly.

14. The display device of claim 8, wherein:
the fan assembly comprises a fan outlet, and
the air exiting the fan assembly via the fan outlet is directed toward the vent outlet.

15. An electronic device, comprising:
a housing that defines an internal volume, the housing comprising a vent inlet and a vent outlet;
a heat-generating component located in the internal volume;
a fan assembly located in the internal and configured to drive air into the housing through the vent inlet, wherein the heat-generating component is upstream with respect to the fan assembly and the vent outlet is downstream with respect to the fan assembly;
a first audio speaker; and
a second audio speaker, wherein the first audio speaker and the second audio speaker direct the air toward the fan assembly.

16. The electronic device of claim 15, wherein:
the housing comprises a first sidewall and a second sidewall,
the vent inlet comprises a first plurality of openings formed into the first sidewall, and
the vent outlet comprises a second plurality of openings formed into the second sidewall.

17. The electronic device of claim 15, wherein the heat-generating component comprises a backlit device.

18. The electronic device of claim 15, further comprising:
a display module coupled with the housing; and
processing circuitry disposed in the internal volume, the processing circuitry configured to electrically couple with a computing device that is external to the housing.

19. The electronic device of claim 18, further comprising a power supply unit configured to power:
a seperate electronic device that drives the display module; and
an accessory device, wherein the seperate electronic device and the accessory device are external relative to the housing.

\* \* \* \* \*